(12) United States Patent
Tanaka

(10) Patent No.: US 10,609,849 B2
(45) Date of Patent: Mar. 31, 2020

(54) ELECTROMAGNETIC SHIELDING MATERIAL

(71) Applicant: JX Nippon Mining & Metals Corporation, Tokyo (JP)

(72) Inventor: Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/917,420

(22) Filed: Mar. 9, 2018

(65) Prior Publication Data

US 2018/0263145 A1 Sep. 13, 2018

(30) Foreign Application Priority Data

Mar. 13, 2017 (JP) .................................. 2017-047792

(51) Int. Cl.
*B32B 7/12* (2006.01)
*H05K 9/00* (2006.01)
(Continued)

(52) U.S. Cl.
CPC ......... *H05K 9/0088* (2013.01); *B29C 43/003* (2013.01); *B29C 43/10* (2013.01);
(Continued)

(58) Field of Classification Search
CPC ....... B29C 43/003; B29C 43/10; B32B 15/08; B32B 15/088; B32B 15/09; B32B 15/18;
(Continued)

(56) References Cited

U.S. PATENT DOCUMENTS

| 2005/0208798 | A1 | 9/2005 | Shimoda | |
| 2014/0162084 | A1* | 6/2014 | Kammuri | B32B 15/08 428/606 |
| 2015/0064493 | A1* | 3/2015 | Tanaka | B32B 7/02 428/607 |

FOREIGN PATENT DOCUMENTS

| EP | 2439063 A1 | 4/2012 |
| EP | 2803481 A1 | 11/2014 |
| | (Continued) | |

OTHER PUBLICATIONS

JP-07290449-A Machine Translation (Year: 1995).*
(Continued)

*Primary Examiner* — Travis M Figg
(74) *Attorney, Agent, or Firm* — Marshall, Gerstein & Borun LLP

(57) ABSTRACT

Provided is an electromagnetic wave shielding material including a multilayer structure in which at least one metal foil and at least two resin layers are closely laminated, wherein both surfaces of each metal foil are closely laminated to the resin layers; wherein each metal foil satisfies the following relationship with each of the two resin layers adjacent to the metal foil: $0.02 \leq V_M/V_{M'} \leq 1.2$, in which: $V_M$ is a volume fraction of the metal foil relative to a total volume of the metal foil and the resin layer; $V_{M'}$ is $(\sigma_R - \sigma_{R'})/(\sigma_M + \sigma_R - \sigma_{R'})$; $\sigma_M$ is a true stress (MPa) of the metal foil at breakage when a tensile stress is applied to the metal foil; $\sigma_R$ is a true stress (MPa) of the resin layer at breakage when a tensile stress is applied to the resin layer; and $\sigma_{R'}$ is a true stress (MPa) of the resin layer when a logarithmic strain same as a logarithmic strain at breakage of the metal foil is applied to the resin layer.

11 Claims, 1 Drawing Sheet
(1 of 1 Drawing Sheet(s) Filed in Color)

(51) Int. Cl.
| | |
|---|---|
| B32B 15/09 | (2006.01) |
| B32B 15/08 | (2006.01) |
| B32B 15/088 | (2006.01) |
| B32B 15/18 | (2006.01) |
| B32B 15/20 | (2006.01) |
| B32B 27/36 | (2006.01) |
| B32B 27/28 | (2006.01) |
| B32B 27/34 | (2006.01) |
| B32B 37/10 | (2006.01) |
| B32B 37/18 | (2006.01) |
| C25D 3/12 | (2006.01) |
| C25D 3/56 | (2006.01) |
| C25D 3/08 | (2006.01) |
| B32B 37/12 | (2006.01) |
| B32B 37/14 | (2006.01) |
| B32B 38/00 | (2006.01) |
| B29C 43/00 | (2006.01) |
| B29C 43/10 | (2006.01) |
| B32B 7/02 | (2019.01) |
| B29K 705/12 | (2006.01) |
| B29L 31/34 | (2006.01) |
| B29L 31/30 | (2006.01) |
| B29K 79/00 | (2006.01) |
| B29K 77/00 | (2006.01) |
| B29K 67/00 | (2006.01) |
| B29K 105/00 | (2006.01) |
| B29K 705/02 | (2006.01) |
| B29K 705/10 | (2006.01) |

(52) U.S. Cl.
CPC .............. *B32B 7/02* (2013.01); *B32B 7/12* (2013.01); *B32B 15/08* (2013.01); *B32B 15/088* (2013.01); *B32B 15/09* (2013.01); *B32B 15/18* (2013.01); *B32B 15/20* (2013.01); *B32B 27/281* (2013.01); *B32B 27/34* (2013.01); *B32B 27/36* (2013.01); *B32B 37/10* (2013.01); *B32B 37/12* (2013.01); *B32B 37/144* (2013.01); *B32B 37/185* (2013.01); *B32B 38/0012* (2013.01); *C25D 3/08* (2013.01); *C25D 3/12* (2013.01); *C25D 3/562* (2013.01); *H05K 9/0084* (2013.01); *B29K 2067/003* (2013.01); *B29K 2077/00* (2013.01); *B29K 2079/08* (2013.01); *B29K 2105/256* (2013.01); *B29K 2705/02* (2013.01); *B29K 2705/10* (2013.01); *B29K 2705/12* (2013.01); *B29L 2031/30* (2013.01); *B29L 2031/34* (2013.01); *B32B 2255/06* (2013.01); *B32B 2255/20* (2013.01); *B32B 2255/205* (2013.01); *B32B 2307/212* (2013.01); *B32B 2311/12* (2013.01); *B32B 2311/22* (2013.01); *B32B 2311/24* (2013.01); *B32B 2311/30* (2013.01); *B32B 2367/00* (2013.01); *B32B 2377/00* (2013.01); *B32B 2379/08* (2013.01); *B32B 2457/00* (2013.01); *B32B 2605/08* (2013.01)

(58) Field of Classification Search
CPC ....... B32B 15/20; B32B 27/281; B32B 27/34; B32B 27/36; B32B 37/10; B32B 37/12; B32B 37/144; B32B 37/185; B32B 38/0012; B32B 7/02; B32B 7/12; B32B 2255/06; B32B 2255/20; B32B 2255/205; B32B 2307/212; B32B 2311/12; B32B 2311/22; B32B 2311/24; B32B 2311/30; B32B 2367/00; B32B 2377/00; B32B 2379/08; B32B 2457/00; B32B 2605/08; C25D 3/08; C25D 3/12; C25D 3/562; H05K 9/0084; H05K 9/0088; B29K 2067/003; B29K 2077/00; B29K 2079/08; B29K 2105/256; B29K 2705/02; B29K 2705/10; B29K 2705/12; B29L 2031/30; B29L 2031/34

See application file for complete search history.

(56) References Cited

FOREIGN PATENT DOCUMENTS

| | | | |
|---|---|---|---|
| JP | 7-290449 | | 11/1995 |
| JP | 07290449 A | * | 11/1995 |
| JP | 2003-285002 A | | 10/2003 |
| JP | 2010100887 A | * | 5/2010 |
| JP | 4602680 B2 | | 12/2010 |
| JP | 2017-005214 A | | 1/2017 |

OTHER PUBLICATIONS

Search Report in EP Application No. 18161452.0 dated Jun. 29, 2018, 11 pages.

Modrea et al., "Tensile Tests on Four Layers CSM600 Glass Fibers-reinforced Polylite 440-M888 Polyester Resin", Procedia Technology 19, 2015, pp. 284-290.

Kojima et al., "Effect of Cutter Tip Angle on Cutting Characteristics of Acrylic Worksheet Subjected to Punch/Die Shearing", AIMS Materials Science, 3(4), Dec. 5, 2016, pp. 1728-1747.

* cited by examiner

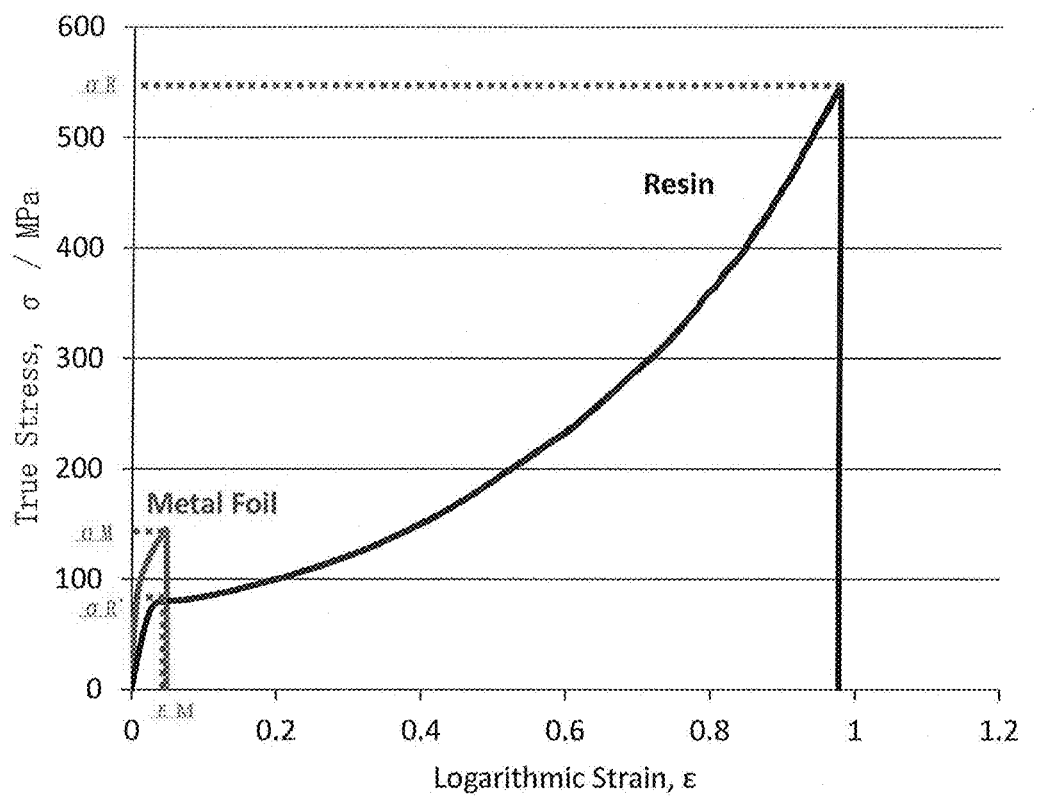

ns relates to an electromagnetic wave shielding material. More particularly, the present invention relates to an electromagnetic wave shielding material that is applicable to covering materials or cladding materials for electric and electronic devices.

ELECTROMAGNETIC SHIELDING MATERIAL

TECHNICAL FIELD

The present invention relates to an electromagnetic wave shielding material. More particularly, the present invention relates to an electromagnetic wave shielding material that is applicable to covering materials or cladding materials for electric and electronic devices.

BACKGROUND ART

Recently, high attention has been widely focused on global environmental issues, and environmentally-friendly motor vehicles equipped with secondary batteries such as electric vehicles and hybrid vehicles have progressively prevailed. These motor vehicles often employ a mode of converting direct current generated from the mounted secondary battery into alternating current through an inverter, and then supplying required electric power to the alternating current motor to provide driving force. Electromagnetic waves are generated due to switching operation of the inverter and the like. Since the electromagnetic waves disturb reception of on-board acoustic equipment or wireless equipment or the like, countermeasures have been taken to house the inverter or the battery, motor or the like together with the inverter in a metallic case to shield the electromagnetic waves (Japanese Patent Application Publication No. 2003-285002 A). Metals with high magnetic permeability have been used as electromagnetic wave shielding materials to shield low frequency electromagnetic fields of 1 MHz or less, in particular low frequency electromagnetic fields of 500 kHz or less.

The electromagnetic waves are emitted not only from the motor vehicles but also from many electric and electronic devices including communication devices, displays and medical devices. The electromagnetic waves may cause erroneous operation of precision devices, and an adverse effect on a human body is further concerned. Therefore, various techniques have been developed for reducing the adverse effects of the electromagnetic waves using an electromagnetic wave shielding material. For example, a copper foil composite obtained by laminating a copper foil and a resin film has been used as the electromagnetic wave shielding material (Japanese Patent Application Publication No. H07-290449 A). The copper foil has an electromagnetic wave shielding property, and the resin film is laminated for reinforcement of the copper foil. An electromagnetic wave shielding structure is also known, in which metal layers are laminated on an inner side and an outer side of an intermediate layer made of an insulating material (Japanese Patent No. 4602680). There is also known a technique for obtaining an electromagnetic wave shielding effect with an improved electromagnetic wave shielding property, light weight property and formability by alternately laminating metal foils and resin layers (Japanese Patent Application Publication No. 2017-5214 A).

CITATION LIST

Patent Literatures

Patent Document 1: Japanese Patent Application Publication No. 2003-285002 A
Patent Document 2: Japanese Patent Application Publication No. H07-290449 A
Patent Document 3: Japanese Patent No. 4602680
Patent Document 4: Japanese Patent Application Publication No. 2017-5214 A

SUMMARY OF INVENTION

Technical Problem

Electrical and electronic devices have various shapes. To cover them with electromagnetic wave shielding materials without waste, the electromagnetic wave shielding materials are required for being molded into various shapes. Conventionally, a pressed metal plate is often used, but it is necessary to increase the thickness of the metal plate in order to ensure press moldability. Also, a thicker metal plate is required in order to obtain a sufficient shielding property by the metal plate. In motor vehicles, a thinner metal plate is desirable because weight reduction is a major issue in terms of improvement of fuel economy.

Further, a plurality of press processes are required for forming the metal plate into a complicated shape, so that a plurality of press dies are required. A die for the press processing requires precision, so that it will require producing costs. Therefore, there is also a problem that large costs are required every time the design is changed. Accordingly, there would be a need for a technique capable of molding an electromagnetic wave shielding material at a lower cost.

On the other hand, pressure forming is known as a method for molding a resin or the like at a lower cost. The pressure forming requires only one mold, so that it is not necessary to consider a clearance between the molds and the mold can be manufactured at a relatively low cost. Further, the pressure forming allows processing into a complicated shape by one molding, so that it is not necessary to prepare a plurality of molds. Furthermore, according to the pressure forming, a thinner material can be processed, and a thinner metal plate can be made. However, in general, as the metal plater is thinner, the ductility is decreased. Therefore, simply thinning of the metal plate will lead to poor formability. On the other hand, thickening of the metal plate will read to higher strength, so that the metal plate cannot be molded by compressed air.

The prior art documents also discloses techniques that aim at improving the formability of the electromagnetic wave shielding material. However, there is still room for improvement. The present invention has been made in view of the above circumstances, and one of the objects of the present invention is to provide an electromagnetic wave shielding material with improved formability.

Solution to Problem

When a tensile stress is applied to a single metal foil, the whole metal foil is not uniformly deformed but is locally deformed. The stress concentrates on the local deformed portion and results in breakage, so that the ductility is not high. On the other hand, the resin layer tends to be uniformly deformed as a whole, so that it has higher ductility than the metal foil. When the metal foil and the resin layer are laminated in close contact with each other, the resin layer supports the metal foil, so that the metal foil is also uniformly deformed, the ductility is improved and the breakage during molding is suppressed. In particular, the ductility of the metal foil is significantly improved by satisfying a predetermined relationship between the stresses at breakage generated when tensile stresses are applied to the metal foil and the resin layer, respectively. The supporting of both surfaces of the metal foil by the resin layers will lead to further improvement of the ductility, as compared with the supporting of only one surface of the metal foil by the resin layer.

Thus, in one aspect, the present invention provides an electromagnetic wave shielding material comprising a multilayer structure in which at least one metal foil and at least two resin layers are closely laminated, wherein both surfaces of each metal foil are closely laminated to the resin layers;

wherein each metal foil satisfies the following relationship with each of the two resin layers adjacent to the metal foil:

$0.02 \leq V_{M'}/V_M \leq 1.2$, in which:

$V_M$ is a volume fraction of the metal foil relative to a total volume of the metal foil and the resin layer;

$V_{M'}$ is $(\sigma_R - \sigma_{R'})/(\sigma_M + \sigma_R - \sigma_{R'})$;

$\sigma_M$ is a true stress (MPa) of the metal foil at breakage when a tensile stress is applied to the metal foil;

$\sigma_R$ is a true stress (MPa) of the resin layer at breakage when a tensile stress is applied to the resin layer; and $\sigma_{R'}$ is a true stress (MPa) of the resin layer when a logarithmic strain same as a logarithmic strain at breakage of the metal foil is applied to the resin layer.

In one embodiment of the electromagnetic wave shielding material according to the present invention, each metal foil satisfies the following relationship with each of the two resin layers adjacent to the metal foil:

$0.2 \leq V_{M'}/V_M \leq 0.6$.

In another embodiment of the electromagnetic wave shielding material according to the present invention, each metal foil forming the electromagnetic wave shielding material has a thickness of 4 to 100 μm.

In yet another embodiment of the electromagnetic wave shielding material according to the present invention, each resin layer forming the electromagnetic wave shielding material has a thickness of 4 to 250 μm.

In yet another embodiment of the electromagnetic wave shielding material according to the present invention, the metal foil and the resin layers forming the electromagnetic wave shielding material are closely laminated by thermocompression bonding without interposing an adhesive layer.

In yet another embodiment of the electromagnetic wave shielding material according to the present invention, a total thickness of the at least one metal foil is 100 μm or less, and a total thickness of the resin layers is 500 μm or less.

In another aspect, the present invention provides a method for producing an electromagnetic wave shielding molded article comprising molding the electromagnetic wave shielding material according to the present invention.

In one embodiment of the method for producing the electromagnetic wave shielding molded article according to the present invention, the molding is carried out by pressure forming.

Advantageous Effects of Invention

The electromagnetic wave shielding material according to the present invention has improved formability. In other words, the electromagnetic wave shielding material is not liable to be broken during molding. Therefore, the electromagnetic wave shielding material can be molded following the complicated external form of the electric/electronic devices, which will contribute to the space saving of the electric/electronic devices. In particular, the electromagnetic wave shielding material according to the present invention is suitable for pressure forming. The forming of the electromagnetic wave shielding material by pressure forming will allow significant contribution to cost reduction of the electric and electronic device.

BRIEF DESCRIPTION OF DRAWINGS

The patent or application file contains at least one drawing executed in color. Copies of this patent or patent application publication with color drawings will be provided by the Office upon request and payment of the necessary fee.

FIG. 1 is a graph schematically showing a relationship between a true stress and a logarithmic strain for a resin layer and a metal foil.

DESCRIPTION OF EMBODIMENTS (Metal Foil)

Materials of the metal foil(s) for use in the electromagnetic wave shielding material according to the present invention are not particularly limited, but metal materials with high conductivity are preferred in terms of improving a shielding property against an alternating magnetic field and an alternating electric field. Specifically, the metal foil may be preferably formed by a metal having a conductivity of $1.0 \times 10^6$ S/m (a value at 20° C.; the same will apply hereinafter) or more. The conductivity of the metal may be more preferably $10.0 \times 10^6$ S/m or more, and still more preferably $30.0 \times 10^6$ S/m or more, and most preferably $50.0 \times 10^6$ S/m or more. Examples of the metals include iron having a conductivity of about $9.9 \times 10^6$ S/m, nickel having a conductivity of about $14.5 \times 10^6$ S/m, aluminum having a conductivity of about $39.6 \times 10^6$ S/m, copper having a conductivity of about $58.0 \times 10^6$ S/m, and silver having a conductivity of about $61.4 \times 10^6$ S/m. In view of both electric conductivity and costs, aluminum or copper may be preferably employed for practical use. All of the metal foils that can be used in the electromagnetic shielding material according to the present invention may be made of the same metal, or different metals may be used for each layer. Further, alloys containing the metals mentioned above may be used.

Various surface-treated layers may be formed on the surface(s) of the metal foil(s) for the purpose of adhesion promotion, environmental resistance, heat resistance and rust prevention. For example, the metal foil(s) may be subjected to Au plating, Ag plating, Sn plating, Ni plating, Zn plating, Sn alloy plating (Sn—Ag, Sn—Ni, Sn—Cu, and the like), a chromate treatment or the like, in order to improve environmental resistance and heat resistance that will be required when the metal surface is the outermost layer. These treatments may be combined. The Sn plating or the Sn alloy plating may be preferred in terms of costs. Further, the metal foil(s) may be subjected to the chromate treatment, a roughening treatment, Ni plating or the like in order to improve adhesion between the metal foil and the resin layer. These treatments may be combined. The roughening treatment may be preferred because it will easily provide the adhesion. Further, it is possible to provide at least one metal layer having high relative magnetic permeability in order to improve the shielding effect against the direct current magnetic field. Examples of the metal layer having high relative magnetic permeability include Fe—Ni alloy plating, Ni plating, and the like.

When using the copper foil, copper having a high purity may be preferred because it will improve the shielding performance. The purity may be preferably 99.5% by mass or more, and more preferably 99.8% by mass or more. Examples of the copper foil that can be used include rolled copper foils, electrolytic copper foils, metallized copper foils and the like. Among them, the rolled copper foils may be preferred because they have good flexibility and formability. When at least one alloy element is added to the copper foil to form a copper alloy foil, the total content of the alloy element(s) and unavoidable impurities may be less than 0.5% by mass. In particular, the copper foil may preferably contain one or more selected from the group consisting of Sn, Mn, Cr, Zn, Zr, Mg, Ni, Si, and Ag in the total amount of from 200 to 2000 ppm by mass, in order to improve elongation as compared with a pure copper foil having the same thickness.

The thickness of the metal foil(s) used for the electromagnetic shielding material according to the present invention may be preferably 4 μm or more per one foil. The thickness of less than 4 μm mayl lead to difficulty of handling, as well as significantly decreased ductility of the metal foil, resulting in insufficient formability of the shielding material. Also, if the thickness of one foil is less than 4 μm, the lamination of a large number of metal foils will be required for obtaining the excellent electromagnetic shielding effect, thereby causing a problem of an increase in manufacturing costs. From such viewpoints, the thickness of one metal foil may be preferably 10 μm or more, and more preferably 15 μm or more, and still more preferably 20 μm or more, and even more preferably 25 μm or more, and still more preferably 30 μm or more. On the other hand, if the thickness of one foil exceeds 100 μm, the strength will be excessively increased, so that the pressure forming may be difficult. Therefore, the thickness of one foil may preferably be 100 μm or less, and more preferably 50 μm or less, and even more preferably 45 μm or less, and still more preferably 40 μm or less.

Although one metal foil may be used for the electromagnetic wave shielding material, a plurality of metal foils forming the shielding material may be preferably laminated via resin layers, in terms of improving the formability and shielding performance. More preferably, three or more metal foils are laminated via the resin layers in terms of ensuring the excellent electromagnetic wave shielding property while decreasing the total thickness of the metal foils. The lamination of three or more metal foils significantly improves the shielding effect as compared with the single metal foil layer or two metal foil layers laminated via a resin layer, even if the metal foil(s) have the same total thickness. Even if the metal foils are directly stacked, the shielding effect will be improved due to an increase in the total thickness of the metal foils, but a remarkable improvement effect cannot be obtained. In other words, when a plurality of metal foils forming the shielding material are laminated via the resin layers, the total thickness of the metal foils needed to obtain the same electromagnetic wave shielding effect can be decreased, thereby achieving both of the weight reduction of the electromagnetic wave shielding material and the electromagnetic wave shielding effect.

The reason would be that the presence of the resin layers between the metal foils increases the number of reflections of electromagnetic waves to attenuate the electromagnetic waves. However, although the lamination of an increased number of metal foils tends to improve the electromagnetic shielding property, the increased number of the laminated metal foils increases the number of lamination steps, which will lead to an increase in manufacturing costs and will not provide further improvement of the shielding effect. Therefore, the number of the metal foils in the shielding material may be preferably 5 or less, and more preferably 4 or less.

Therefore, in one embodiment of the electromagnetic shielding material according to the present invention, the total thickness of the metal foils may be 100 μm or less, or 80 μm or less, or 60 μm or less, or 40 μm or less. In one embodiment of the shielding material according to the present invention, the total thickness of the metal foils may be 4 μm or more, 8 μm or more, 12 μm or more, or 16 μm or more.

(Resin Layer)

In general, resin layers have higher ductility than metal foils. Therefore, by supporting both surfaces of each metal foil by resin layers, the ductility of the metal foil can be remarkably improved and the formability of the shielding material can be significantly improved. Even if the metal foils are directly stacked to each other, the effect of improving the formability cannot be obtained.

Resin layers having a larger impedance difference from the metal layer may be preferred in order to obtain an excellent electromagnetic shielding effect. To generate the larger impedance difference, the resin layers should have a smaller relative dielectric constant. More specifically, the relative dielectric constant may preferably be 10 (a value at 20° C.; the same will apply hereinafter) or less, and more preferably 5.0 or less, and still more preferably 3.5 or less. In principle, the relative dielectric constant is never smaller than 1.0. For generally available materials, the relative dielectric constant is at least about 2.0. Even if the relative dielectric constant is lowered to be close to 1.0, the increase in the shielding effect is limited, while a special and expensive material must be used. In view of the balance between the cost and the effect, the relative dielectric constant may preferably be 2.0 or more, and more preferably 2.2 or more.

For materials making up the resin layers, synthetic resins are preferable in terms of processability. Further, for the materials making up the resin layers, those in the form of film may be used. The resin layer may contain fiber reinforcing materials such as carbon fibers, glass fibers and aramid fibers. In terms of availability and processability, the synthetic resins include olefinic resins such as polyester (e.g. PET (polyethylene terephthalate), PEN (polyethylene naphthalate) and PBT (polybutylene terephthalate)), polyethylene and polypropylene; polyamides; polyimides; liquid crystal polymers; polyacetals; fluororesins; polyurethanes; acryl resins; epoxy resins; silicone resins; phenol resins; melamine resins; ABS resins; polyvinyl alcohol; urea resins; poly(vinyl chloride); polycarbonates; polystyrenes; styrene-butadiene rubbers; and the like. Among them, PET, PEN, polyamides, and polyimides may be preferred in terms of processability and costs. The synthetic resins may be elastomers such as urethane rubbers, chloroprene rubbers, silicone rubbers, fluororubbers, styrene-based elastomers, olefinic elastomers, vinyl chloride-based elastomers, urethane-based elastomers, amide-based elastomers and the like. Among them, polyimides, polybutylene terephthalate, polyamides, polyurethane and the like which are easily bonded to the metal foil by thermocompression bonding may be suitably used. All the resin layers used in the electromagnetic wave shielding material according to the present invention may be made of the same resin or they may be made of different resins for each layer.

The surfaces of the resin layers may be subjected to various surface treatments for the purpose of promoting adhesion to the metal foil, or the like. For example, the adhesion to the metal foil can be enhanced by performing primer coating or corona treatment on the surfaces of the resin films bonded to the metal foil.

The thickness of the resin layers is not particularly limited. However, in terms of enhancing the effect of improving the ductility of the metal foil, the total thickness of the resin layers may preferably be 10 μm or more, and more preferably 20 μm or more, and more preferably 40 μm or more, and still more preferably 80 μm or more, and even more preferably 100 μm or more. However, if the total thickness of the resin layers is excessively increased, the strength will become excessively high, thereby leading to difficulty of pressure forming. Therefore, the total thickness of the resin layers may preferably be 500 μm or less, and more preferably 400 μm or less, and more preferably 300 μm or less.

Also, in terms of enhancing the effect of improving the ductility of metal foil, the thickness of one resin layer may be preferably 4 μm or more, and more preferably 7 μm or more, and more preferably 10 μm or more, and still more preferably 20 μm or more, and still more preferably 40 μm or more, and even more preferably 80 μm or more, and even more preferably 100 μm or more. However, if the thickness of one resin layer is excessively increased, the strength will become excessively high, thereby leading to difficulty of pressure forming. Therefore, the thickness of one resin layer may be preferably 250 μm or less, and more preferably 200 μm or less.

Examples of a method for closely laminating the resin layers and the metal foil(s) include thermocompression bonding, ultrasonic bonding, bonding with an adhesive, and a method of forming a film by applying a resin in a molten state onto the metal foil and curing the resin, and the like. Among them, the thermocompression bonding is preferable in terms of the stability of the adhesive strength. The thermocompression bonding is a method of heating both of the resin layers and the metal foil(s) at a temperature lower than melting points of the both, and then applying a pressure to bring them into close contact with each other, and generating plastic deformation to bond them. However, in the present invention, the heating at a temperature exceeding the melting points of the resin layers as described below is considered to be the thermocompression bonding. It is also preferable to employ thermosonic bonding which is thermocompression-bonded while applying ultrasonic vibration. Although it is also possible to laminate the resin layers and the metal foil(s) via an adhesive, the adhesive will result in lower strength than the resin films as described below. Therefore, it is necessary to appropriately select the thickness or tensile elasticity of the adhesive so as not to inhibit the effect of improving the ductility of the metal foil that will be obtained by laminating the resin layers thereon. For this reason, the thermal compression bonding is preferable because it is simple and can easily obtain the effect of improving the ductility. However, there are resin materials in which the thermocompression bonding is difficult, such as PET. Therefore, in that case, it is preferable to use the adhesive.

For the thermocompression bonding, the resin layers may be preferably heated at a temperature lower by 30° C. than the melting points of the resin layers or at a higher temperature, and more preferably heated at a temperature lower by 20° C. than the melting points of the resin layers or at a higher temperature, and even more preferably heated at a temperature lower by 10° C. than the melting points of the resin layers or at a higher temperature, in terms of improving the adhesion between the resin layers and the metal foil(s). However, if excessive heat is applied, the resin layers will be melted and pushed out by pressure to impair uniformity of the thickness and physical properties. Therefore, the heating during the thermocompression bonding may be preferably carried out at a temperature higher by 20° C. than the melting points of the resin layers or at a lower temperature, and more preferably at a temperature higher by 10° C. than the melting points of the resin layers or at a lower temperature, and still more preferably at a temperature lower than or equal to the melting points of the resin layers. Further, a pressure during the thermocompression bonding may preferably be 0.05 MPa or more, and more preferably 0.1 MPa or more, and even more preferably 0.15 MPa or more, in terms of improving the adhesion between the resin layers and the metal foil(s). However, even if the pressure is excessively applied, the adhesion will not only be improved, but also the resin layers are deformed to impair the uniformity of the thickness. Therefore, the pressure during the thermocompression bonding may preferably be 60 MPa or less, and more preferably 45 MPa or less, and still more preferably 30 MPa or less.

In general, adhesives have lower strength than resin films. Therefore, the adhesive layer having excessively large thickness tends to prevent improvement of the ductility of the metal foil that will be obtained by laminating of the resin layers thereon. On the other hand, if the adhesive layer is too thin, it will be difficult to apply the adhesive to the entire boundary surface between the metal foil and the resin film, and an unbonded portion will be formed. Therefore, the thickness of the adhesive layer may preferably be 1 μm or more and 20 μm or less, and more preferably 1.5 μm or more and 15 μm or less, and still more preferably 2 μm or more and 10 μm or less.

The strength of the adhesive layer may be increased so as not to prevent improvement of the ductility of the metal foil that will be obtained by laminating the resin layers thereon. However, if the strength is excessively increased, the ductility of the adhesive layer will tend to be decreased, thereby conversely preventing the improvement of the ductility. On the other hand, if the adhesive layer is too soft, the improvement of the ductility will be prevented, even within the thickness range as described above. The tensile elasticity of the adhesive layer may preferably be from 1 MPa to 1500 MPa, and more preferably from 3 MPa to 1000 MPa, and still more preferably from 5 MPa to 800 MPa. In the present invention, the tensile elasticity of the adhesive layer is measured according to JIS K7161-1:2014, on an adhesive film obtained by applying the adhesive to be measured onto a substrate such as a film, drying and curing the adhesive, and then being peeled off from the substrate.

(Electromagnetic Wave Shielding Material)

The electromagnetic wave shielding material (also simply referred to as "shielding material") may have a structure in which one, preferably two or more, and more preferably three or more metal foils, is/are closely laminated via the resin layers. In this case, each metal foil may preferably have such a structure that both surfaces of each metal foil are closely laminated to the resin layers, in order to improve the ductility of the metal foil(s) and to provide improved formability of the shielding material. In other words, an embodiment where both outermost layers are formed with the resin layers and where the resin layers and the metal foils are alternately laminated one by one is more preferable than embodiments where the metal foil(s) form the outermost layer(s) of the shielding material, and embodiments having a position where a plurality of metal foils are laminated without interposing the resin layer(s) in the inner layers of the shielding material.

Examples of the laminated structure of the electromagnetic wave shielding material include the following structures:

(1) a resin layer/a metal foil/a resin layer;
(2) a resin layer/a metal foil/a resin layer/a metal foil/a resin layer; and
(3) a resin layer/a metal foil/a resin layer/a metal foil/a resin layer/a metal foil/a resin layer.

Here, it should be understood that a single "resin layer" as used herein includes a laminate of a plurality of resin layers without interposing a metal foil(s). In other words, in the present invention, a plurality of resin layers laminated without interposing a metal foil(s) are considered to be the single resin layer. Further, in the present invention, the adhesive layer is also considered to be the resin layer.

Therefore, for example, when the electromagnetic wave shielding material has a laminated structure as shown in the following item (4), the laminate of "a resin film/an adhesive layer" is considered to be a single "resin layer". As a result, the laminated structure is considered to be a laminated structure as shown in the following item (4'), which is used for determining whether or not the laminated structure satisfies a range of $V_M/V_{M'}$ as described below on the basis of the relationship with the adjacent metal foil.

(4) (a resin film/an adhesive layer)/a metal foil/(an adhesive layer/a resin film layer);
(4') a resin layer/a metal foil/a resin layer.

Similarly, when the electromagnetic wave shielding material has a laminated structure as shown in the following item (5), the laminate of "a resin film/an adhesive layer" and the laminate of "an adhesive layer/a resin film/an adhesive layer" are considered to be the single "resin layer", respectively. As a result, each of the laminated structures is considered to be a laminated structure as shown in the following (5'), which is used for determining whether or not the laminated structure satisfies a range of $V_M/V_{M'}$ as described below on the basis of the relationship with the adjacent metal foil(s).

(5) (a resin film/an adhesive layer)/a metal foil/(an adhesive layer/a resin film layer/an adhesive layer)/a metal foil/(an adhesive layer/a resin film);
(5') a resin layer/a metal foil/a resin layer/a metal foil/a resin layer.

From the viewpoint of improving the formability of the shielding material, each metal foil preferably satisfies the following relationship with each of the two resin layers adjacent to each metal foil:

$0.02 \leq V_M/V_{M'} \leq 1.2$, in which:

$V_M$ is a volume fraction of the metal foil relative to a total volume of the metal foil and the resin layer;

$V_{M'}$ is $(\sigma_R - \sigma_{R'})/(\sigma_M + \sigma_R - \sigma_{R'})$;

$\sigma_M$ is a stress (MPa) of the metal foil at breakage when a tensile stress is applied to the metal foil;

$\sigma_R$ is a stress (MPa) of the resin layer at breakage when a tensile stress is applied to the resin layer; and $\sigma_{R'}$ is a stress (MPa) of the resin layer when the same strain as a strain ($\varepsilon_M$) at breakage of the metal foil is applied to the resin layer.

As used herein, the "stress" refers to a "true stress" and the "strain" refers to a "logarithmic strain", unless otherwise noted.

The phrase "each metal foil satisfies the following relationship with each of the two resin layers adjacent to the metal foil" means that, in the case of the structure of resin layer 1/metal foil 1/resin layer 2, for example, the ratio $V_M/V_{M'}$ is calculated for each of resin layer 1/metal foil 1 and metal foil 1/resin layer 2, and the both satisfy $0.02 \leq V_M/V_{M'} \leq 1.2$. When the resin layer is formed with a laminate of the resin film and the adhesive layer, the ratio $V_M/V_{M'}$ is calculated based on $\sigma_R$ and $\sigma_{R'}$ for the laminate of the resin film and the adhesive layer.

The $\sigma_M$ and $\varepsilon_M$ of the metal foil is determined for a metal foil alone that is the same as the metal foil forming the shielding material, in accordance with JIS K7127: 1999, by preparing a test piece having a width of 12.7 mm×a length of 150 mm and performing a tensile test in the longitudinal direction of the test piece at a tensile speed of 50 mm/min and at a temperature of 25° C. When the metal foil forming the shielding material has undergone the surface treatment, the measurement is carried out for the metal foil after the surface treatment.

The $\sigma_R$ and $\sigma_{R'}$ of each resin layer is determined for a resin layer alone that is the same as the resin layer forming the shielding material, in accordance with JIS K7127: 1999, by preparing a test piece having a width of 12.7 mm×a length of 150 mm and performing the tensile test in the longitudinal direction of the test piece at a tensile speed of 50 mm/min and at a temperature of 25° C. When the resin layers have undergone the surface treatment, the $\sigma_R$ and $\sigma_{R'}$ are measured for the resin layer after the surface treatment. Further, when the resin layer includes the adhesive layer, the $\sigma_R$ and $\sigma_{R'}$ of the resin layer are measured in a state where the cured adhesive layer has been laminated thereon.

FIG. 1 is a graph schematically showing the relationship between a stress and a strain for the resin layer and the metal foil. According to the mixturing rule, when a tensile force is applied to a laminate in which one metal foil and one resin layer are laminated and when a strain ($\varepsilon_M$) at breakage of the metal foil is applied to the laminate, the stress of the laminate is expressed by $\sigma_M \times V_M + \sigma_{R'} \times (1-V_M)$, and the maximum stress of the laminate where the resin layers in the laminate can support the metal foil without breakage of the resin layer is represented by $\sigma_R \times (1-V_M)$.

If the strain is applied to the laminate when $\sigma_R \times (1-V_M)$ is smaller than $\sigma_M \times V_M + \sigma_{R'} \times (1-V_M)$, the resin layer is broken prior to breakage of the metal foil in the laminate or simultaneously with breakage of the metal foil, so that the strain at breakage of the laminate is equal to the strain of the metal foil, and thus the ductility of the metal foil is not improved. Conversely, when $\sigma_R \times (1-V_M)$ is larger than $\sigma_M \times V_M + \sigma_{R'} \times (1-V_M)$, the application of strain to the laminate allows continued extension of the rein layer without generating the breakage of the resin layer, even under the strain that would otherwise generate the breakage of the metal foil when a tensile force is applied to the metal foil alone. In this case, if the metal foil is closely laminated to the resin layers, the metal foil is not broken and can be continued to extend together with the resin layers. According to the mechanism, the ductility of the metal foil is improved.

Assuming that $V_M$ in the case of $\sigma_R \times (1-V_M) = \sigma_M \times V_M + \sigma_{R'} \times (1-V_M)$ is $V_{M'}$, the $V_{M'}$ can be expressed by the following equation:

$V_{M'} = (\sigma_R - \sigma_{R'})/(\sigma_M + \sigma_R - \sigma_{R'})$.

The present inventor has calculated $V_M$ and $V_{M'}$ for a laminate in which one metal foil and one resin layer are laminated to each other, based on the above equation, and investigated the relationship with the ductility. As a result, the present inventor has found that as the $V_M$ is smaller than the VM', the ductility of the metal foil is improved accordingly. Particularly when the metal foil satisfies the relationship: $V_M/V_{M'} \leq 1.2$ with each of the two resin layers laminated on both surfaces of the metal foil, the formability of the laminate is improved, and when the metal foil satisfies the relationship: $V_M/VM' \leq 0.9$, the formability of the laminate is further improved, and when the metal foil satisfies the relationship: $V_M/VM' \leq 0.6$, the formability of the laminate is even further improved. However, if the ratio $V_M/V_{M'}$ is too small, the film will be too thick or the strength will be too high, so that sufficient molding may not be possible by the molding with compressed air. Therefore, $0.02 \leq V_M/VM'$ is preferable, and $0.1 \leq V_M/VM'$ is more preferable, and $0.2 \leq V_M/VM'$ is even more preferable.

In one embodiment of the electromagnetic wave shielding material according to the present invention, the total thickness of the electromagnetic wave shielding material may be from 50 to 500 μm, or 400 μm or less, or 300 μm or less, or 250 μm or less.

In one embodiment of the electromagnetic wave shielding material according to the present invention, the electromagnetic wave shielding material may have a magnetic field shielding property (a degree of attenuation of signal on a receiving side) of 25 dB or more, and preferably a magnetic field shielding property of 30 dB or more, and more preferably a magnetic field shielding property of 40 dB or more, and more preferably a magnetic field shielding property of 50 dB or more, and even more preferably a magnetic field shielding property of 60 dB or more, for example a magnetic field shielding property of from 36 to 90 dB at 1 MHz. Further, the electromagnetic wave shielding material may preferably have an electric field shielding property of 40 dB or more at 100 MHz, and more preferably an electric field shielding property of 60 dB or more, and even more preferably an electric field shielding property of 80 dB or more. In the present invention, the magnetic field shielding property is measured by a KEC method. The KEC method refers to "an electromagnetic wave shielding property measurement method" in KEC Electronic Industry Development Center.

The electromagnetic wave shielding material according to the present invention can be suitably used for applications of shielding electromagnetic waves emitted from electric/electronic devices (for example, inverters, communication devices, resonators, electron tubes/discharge lamps, electric heating devices, electric motors, generators, electronic components, printed circuits, medical devices and the like).

EXAMPLES

Examples of the present invention are described below together with comparative examples, which are provided for better understanding of the present invention and its advantages, and are not intended to limit the invention.
(1. Preparation of Metal Foil)
The following materials were prepared as metal foils. The conductivity was measured according to the double bridge method of JIS C2525: 1999.
Cu: a rolled copper foil (electric conductivity at 20° C.: $58.0 \times 10^6$ S/m; thickness: see Table 1); only in Example 17, an electrolytic copper foil (conductivity at 20° C.: $58.0 \times 10^6$ S/m; thickness: see Table 1)
For the rolled copper foil, a pure copper foil with no added element and a copper alloy foil with $\sigma_M$ reduced by addition of about 0.2 wt % of Ag were used. In should be noted that there is substantially no change in the conductivity because of the addition of a minor amount of Ag.
Al: an aluminum foil (conductivity at 20° C.: $39.6 \times 10^6$ S/m; thickness: see Table 1)
The aluminum foil was produced by rolling an aluminum material having a higher thickness. The $\sigma_M$ was changed by a working ratio in the final rolling. The $\sigma_M$ can be increased by increasing the working ratio and can be reduced by lowering the working ratio.
Ni: a nickel foil (commercial product, conductivity at 20° C.: $14.5 \times 10^6$ S/m, thickness: see Table 1)
Fe: an iron foil (commercial product; conductivity at 20° C.: $9.9 \times 10^6$ S/m; thickness: see Table 1)
SUS: a stainless steel foil (commercial product; conductivity at 20° C.: $1.4 \times 10^6$ S/m; thickness: see Table 1)
<Surface Treatment>
The surface treatment was carried out on both surfaces of the metal foil according to the conditions as described in Table 1 depending on the test numbers. In the tables, the symbol "–" means that no surface treatment was carried out.
Roughening Treatment: using a roughening treatment solution (Cu: from 10 to 25 g/L; $H_2SO_4$: from 20 to 100 g/L; temperature: from 25 to 35° C.), electrolysis was performed at a current density of from 30 to 70 A/dm² for 1 to 5 seconds. Then, Ni—Co plating was performed at a temperature of from 30 to 50° C. and at a current density of from 1 to 4 A/dm² using a Ni—Co plating solution (Co ion concentration: from 5 to 15 g/L; Ni ion concentration: from 5 to 15 g/L).
Silane Treatment: the immersion treatment in an epoxysilane treatment solution (epoxy silane: an aqueous solution of 0.1 to 2 wt %) was carried out.
Chromate Treatment: electrolysis was carried out at a current density of from 0.5 to 2 A/dm² using a chromate bath ($K_2Cr_2O_7$: from 0.5 to 5 g/L; temperature: from 50 to 60° C.).
Ni Plating+Chromate Treatment: using a Ni plating bath (watts bath with a Ni ion concentration of from 15 to 25 g/L), Ni plating was carried out at a plating solution temperature of from 30 to 50° C. and at a current density of from 1 to 4 A/dm², and the chromate treatment was then carried out in the same way as described above.
The stress ($\sigma_M$: MPa) and strain ($\varepsilon_M$) at breakage when applying the tensile stress were measured for each of these metal foils by the method as described above using a tensile tester of Model AGS-X available from Shimadzu Corporation. The results are shown in Tables 3 to 5.
(2. Preparation of Resin Layer)
The following materials were prepared as resin films. All of them are commercially available products. The relative dielectric constant was measured according to the method B of JIS C2151: 2006.
PET: a polyethylene terephthalate film (relative dielectric constant at 20° C.: from 3.0 to 3.5; melting point: 220° C.; thickness: see Table 1)
For PET, the $\sigma_R$ was changed by using PET films having various grades from multiple manufacturers. It is possible to change the $\sigma_R$ by varying stretching conditions or by blending various types of monomers having different molecular structures. For example, when a degree of stretching during biaxial stretching is increased, a degree of crystallinity will be increased and the $\sigma_R$ can be thus increased, and when the degree of stretching is decreased, the degree of crystallinity will be reduced and the $\sigma_R$ can be thus decreased. Further, even if the degrees of stretching are the same, the incorporation of a monomer that is difficult to crystallize will lead to a decrease in the degree of crystallinity, so that the $\sigma_R$ can be decreased.

PI: a polyimide film (relative dielectric constant at 20° C.: 3.5; melting point: none; thickness: see Table 1)

PA: a polyamide film (relative dielectric constant at 20° C.: 6.0; melting point: 300° C.; thickness: see Table 1)

In addition, the following isocyanate-cured type polyurethane adhesive was prepared as the adhesive.

Adhesive: a main agent: RU-80; a curing agent: H-5, both of which are available from Rock Paint Co., Ltd.

The tensile elasticity after curing of the adhesive was measured using a precision universal testing apparatus AGS-X available from Shimadzu Corporation according to the method as described above and was found that it was 600 MPa.

The PET was closely laminated to the metal foil using the adhesive. In this case, one resin layer is composed of a laminate of the PET and the adhesive layer, according to the definition as described above. Therefore, when the PET was used for the resin layer, depending on whether the metal foils were laminated to both surfaces of the PET or the metal foil was laminated to one surface of the PET, the adhesive layer(s) was/were applied onto both surfaces or one surface of the PET and cured under the same conditions as those for bonding to the metal foil to form a laminate. Then, the stress ($\sigma_R$: MPa) at breakage when applying the tensile stress and the stress ($\sigma_{R'}$: MPa) when applying the same strain as a strain ($\varepsilon_M$) at breakage of the metal foil were measured for the laminate by the method as described above using the tensile testing apparatus of Model AGS-X available from Shimadzu Corporation. The results are shown in Tables 3 to 5.

PI and PA were closely laminated to the metal foils without using the adhesive. Therefore, when the PI or PA was used for the resin layer, the stress ($\sigma_R$: MPa) at breakage when applying the tensile stress and the stress ($\sigma_{R'}$: MPa) when applying the same stress as the stress ($\varepsilon_M$: MPa) at the breakage of the metal foil were measured for the resin film alone by the method as described above.

(3. Preparation of Electromagnetic Wave Shielding Material)

Various electromagnetic wave shielding materials having the laminated structures as shown in Table 1 were produced using the metal foils and the resin films as described above. The metal foil and the resin film were laminated such that the areas of the bonding surfaces were the same and they did not protrude from each other. In an example where the PET was used for the resin layer, the adhesive was applied onto the bonding surface of the PET by means of a bar coater (available from Daiichi Rika Co., Ltd.). The thickness of the adhesive layer was adjusted by the solid content of the adhesive and the count of the bar coater. The adhesive was then dried at 80° C. for 1 minute to volatilize excess solvent. The metal foil was attached, and then maintained at 40° C. for 7 days to promote the curing reaction such that the metal foil and the resin layer were closely laminated. In examples of using the PI, the metal foil and the resin layer were closely laminated by means of thermocompression bonding at 330° C. for 0.5 hour under a pressure of 4 MPa without using any adhesive. In examples of using the PA, the metal foil and the resin layer were closely laminated by means of thermocompression bonding at 300° C. for 0.5 hour under a pressure of 6 MPa without using any adhesive.

For each electromagnetic wave shielding material obtained, the $V_M$ and VM' were determined with respect to each of the two resin layers adjacent to each metal foil, depending on the laminated structures, and the ratio $V_M$/VM' was calculated. The ratio $V_M$/VM' will be described with reference to Example 1. Example 1 had a laminated structure of PET/Cu/PET (=R1/M1/R2). The volume fraction $V_{M11}$ of M1 for R1 and M1 and the volume fraction $V_{M12}$ of M1 for M1 and R2 are calculated as follows from the thicknesses of R1 and M1, and those of M1 and R2, respectively, because the areas of their bonding surfaces are the same.

The volume fraction $V_{M11}$ of M1 for R1 and M1=Thickness of M1/(Thickness of R1+Thickness of M1)

The volume fraction $V_{M12}$ of M1 for M1 and R2=Thickness of M1/(Thickness of M1+Thickness of R2

When the $V_{M'}$ for R1 and M1 is $V_{M'11}$, it is represented by $V_{M'11}=(\sigma_R1-\sigma_R11)/(\sigma_M1+\sigma_R1-\sigma_R11)$.

$\sigma_M1$: a stress at breakage of M1 when a tensile stress is applied to M1;

$\sigma_R1$: a stress at breakage of R1 when a tensile stress is applied to R1; and $\sigma_R11$: a stress when the same strain as a strain ($\varepsilon_{M1}$) at breakage of M1 is applied to R1.

When the VM' for M1 and R2 is $V_{M'12}$, it is represented by $V_{M'12}=(\sigma_R2-\sigma_R12)/(\sigma_M1+\sigma_R2-\sigma_R12)$.

$\sigma_M1$: a stress at breakage of M1 when a tensile stress is applied to M1;

$\sigma_R2$: a stress at breakage of R2 when a tensile stress is applied to R2; and $\sigma_R12$: a stress when the same strain as a strain ($\varepsilon_{M1}$) at breakage of M1 is applied to R2.

According to the above calculations, the ratio $V_{M11}$/$V_{M'11}$ for R1 and M1 and the ratio $V_{M12}$ $V_{M'12}$ for M1 and R2 were calculated, respectively.

The ratios $V_M$/$V_{M'}$ between the resin layers and the metal foils adjacent to each other were calculated in the same way for other Examples and Comparative examples. The results are shown in Tables 2 and 6.

(4. Molding Test)

Each specimen of sheet-like electromagnetic wave shielding materials each having 90 mm×90 mm was subjected to the molding test in a mold for making a hemisphere having a diameter of 30 mm under a condition of a mold temperature of 25° C. by means of a pressure forming tester (a custom made article from Kitaguchi Seiki Co., Ltd.). A pressure of compressed air was 3 MPa (absolute pressure). However, when the test specimen was broken at 3 MPa, the molding was conducted under a pressure lower than the pressure of compressed air of 3 MPa, but under the maximum pressure of compressed air under which breakage did not occur. A molded article was produced such that the outer peripheral surface side of the hemisphere was the rightmost material shown in the column of "Laminated Structure" in Table 1.

After the pressure forming, the test specimen was taken out and its molding depth was measured. The presence or absence of breakage of the metal foil(s) and the resin layer(s) was also confirmed. The presence or absence of breakage was confirmed by observing not only the outermost layer of the molded article, but also the interior with X-ray CT (micro-CT scanner, TOSCANER 32251 μhd, available from TOSHIBA IT CONTROL SYSTEMS CORPORATION; a tube current of 120 μA; a tube voltage of 80 kV).

The maximum depth which could be molded within the range of the pressure of compressed air of 3 MPa or less without generating breakage for all the metal foils and resin layers was defined as a maximum molding depth of the test specimen. A molded article having a maximum molding depth of less than 4 mm was evaluated as Formability x; a molded article having a maximum molding depth of 4 mm or more and less than 6 mm was evaluated as "○ (single circle)", and a molded article having a maximum molding depth of 6 mm or more was evaluated as "⊚ (double circle)". The results are shown in Table 7.

(Measurement of Shielding Effect)

The electromagnetic wave shielding materials of Examples 1, 2, 4, 5, 24 and 25 were installed in a shielding effect evaluation device (Techno Science Japan Co., Ltd., Model TSES-KEC) and evaluated for the electric field shielding effect at 100 MHz according to the KEC method at a temperature of 25° C. Further, the electromagnetic wave shielding materials of Examples 24 and 25 were evaluated for the magnetic field shielding effect at 1 MHz according to the KEC method at a temperature of 25° C. by means of the same shielding effect evaluation device. The results are shown in Table 7.

TABLE 1

| | Laminated Structure | Surface Treatment of Metal Foil | Thickness of Adhesive (μm) | R1 First Resin Layer Thickness μm | M1 First Metal Layer Thickness μm | R2 Second Resin Layer Thickness μm | M2 Second Metal Layer Thickness μm | R3 Third Resin Layer Thickness μm | M3 Third Metal Layer Thickness μm | R4 Fourth Resin Layer Thickness μm |
|---|---|---|---|---|---|---|---|---|---|---|
| Example 1 | PET/Cu/PET (R1/M1/R2) | Roughening Treatment | 10 | 100 | 35 | 100 | 0 | 0 | 0 | 0 |
| Example 2 | PET/Cu/PET (R1/M1/R2) | Silane Treatment | 10 | 100 | 18 | 100 | 0 | 0 | 0 | 0 |
| Example 3 | PET/Cu/PET (R1/M1/R2) | Roughening Treatment | 3 | 50 | 18 | 50 | 0 | 0 | 0 | 0 |
| Example 4 | PET/Cu/PET (R1/M1/R2) | — | 3 | 50 | 9 | 50 | 0 | 0 | 0 | 0 |
| Example 5 | PET/Cu/PET (R1/M1/R2) | Chromate Treatment | 3 | 12 | 6 | 12 | 0 | 0 | 0 | 0 |
| Example 6 | PET/Cu/PET (R1/M1/R2) | Ni Plating + Chromate Treatment | 3 | 38 | 18 | 38 | 0 | 0 | 0 | 0 |
| Example 7 | PET/Cu/PET (R1/M1/R2) | Roughening Treatment | 3 | 25 | 18 | 25 | 0 | 0 | 0 | 0 |
| Example 8 | PET/Cu/PET (R1/M1/R2) | Roughening Treatment | 3 | 12 | 18 | 12 | 0 | 0 | 0 | 0 |
| Example 9 | PET/Cu/PET (R1/M1/R2) | Roughening Treatment | 3 | 100 | 9 | 100 | 0 | 0 | 0 | 0 |
| Example 10 | PET/Cu/PET (R1/M1/R2) | Roughening Treatment | 10 | 200 | 6 | 200 | 0 | 0 | 0 | 0 |
| Example 11 | PET/Cu/PET (R1/M1/R2) | Roughening Treatment | 3 | 25 | 35 | 25 | 0 | 0 | 0 | 0 |
| Example 12 | PET/Cu/PET (R1/M1/R2) | Roughening Treatment | 3 | 12 | 12 | 12 | 0 | 0 | 0 | 0 |
| Example 13 | PET/Cu/PET (R1/M1/R2) | Roughening Treatment | 3 | 25 | 9 | 25 | 0 | 0 | 0 | 0 |
| Example 14 | PET/Cu/PET (R1/M1/R2) | Roughening Treatment | 10 | 250 | 18 | 250 | 0 | 0 | 0 | 0 |
| Example 15 | PI/Cu/PI (R1/M1/R2) | Roughening Treatment | Thermo-compression Bonding | 50 | 18 | 50 | 0 | 0 | 0 | 0 |
| Example 16 | PA/Cu/PA (R1/M1/R2) | Roughening Treatment | Thermo-compression Bonding | 50 | 18 | 50 | 0 | 0 | 0 | 0 |
| Example 17 | PET/Cu/PET (Cu: Electrolytic Copper Foil) (R1/M1/R2) | Roughening Treatment | 10 | 100 | 18 | 100 | 0 | 0 | 0 | 0 |
| Example 18 | PET/Al/PET (R1/M1/R2) | — | 3 | 50 | 10 | 50 | 0 | 0 | 0 | 0 |
| Example 19 | PET/Al/PET (R1/M1/R2) | — | 10 | 50 | 20 | 50 | 0 | 0 | 0 | 0 |
| Example 20 | PET/Al/PET (R1/M1/R2) | — | 3 | 100 | 40 | 100 | 0 | 0 | 0 | 0 |
| Example 21 | PET/Ni/PET (R1/M1/R2) | — | 3 | 100 | 20 | 100 | 0 | 0 | 0 | 0 |
| Example 22 | PET/Fe/PET (R1/M1/R2) | — | 3 | 100 | 20 | 100 | 0 | 0 | 0 | 0 |
| Example 23 | PET/SUS/PET (R1/M1/R2) | — | 3 | 100 | 20 | 100 | 0 | 0 | 0 | 0 |
| Example 24 | PET/Cu/PET/Cu/PET (R1/M1/R2/M2/R3) | Roughening Treatment | 3 | 100 | 35 | 100 | 35 | 100 | 0 | 0 |
| Example 25 | PET/Cu/PET/Cu/PET/Cu/PET (R1/M1/R2/M2/R3/M3/R4) | Roughening Treatment | 3 | 50 | 18 | 50 | 18 | 50 | 18 | 50 |
| Example 26 | PET/Cu/PET (R1/M1/R2) | Roughening Treatment | 3 | 100 | 18 | 100 | 0 | 0 | 0 | 0 |
| Example 27 | PET/Cu/PET (R1/M1/R2) | Roughening Treatment | 3 | 100 | 18 | 50 | 0 | 0 | 0 | 0 |
| Comparative Example 1 | Cu (M1) | — | — | 0 | 18 | 0 | 0 | 0 | 0 | 0 |
| Comparative | Cu | — | — | 0 | 300 | 0 | 0 | 0 | 0 | 0 |

TABLE 1-continued

|  | Laminated Structure | Surface Treatment of Metal Foil | Thickness of Adhesive (μm) | R1 First Resin Layer Thickness μm | M1 First Metal Layer Thickness μm | R2 Second Resin Layer Thickness μm | M2 Second Metal Layer Thickness μm | R3 Third Resin Layer Thickness μm | M3 Third Metal Layer Thickness μm | R4 Fourth Resin Layer Thickness μm |
|---|---|---|---|---|---|---|---|---|---|---|
| Example 2 | (M1) | | | | | | | | | |
| Comparative Example 3 | Al (M1) | — | — | 0 | 500 | 0 | 0 | 0 | 0 | 0 |
| Comparative Example 4 | Cu/PET (M1/R1) | Roughening Treatment | 3 | 50 | 18 | 0 | 0 | 0 | 0 | 0 |
| Comparative Example 5 | PET/Cu/PET (R1/M1/R2) | Roughening Treatment | 3 | 25 | 35 | 25 | 0 | 0 | 0 | 0 |
| Comparative Example 6 | PET/Cu/PET (R1/M1/R2) | Roughening Treatment | 3 | 100 | 18 | 100 | 0 | 0 | 0 | 0 |
| Comparative Example 7 | Cu/PET/Cu (M1/R2/M2) | Roughening Treatment | 3 | 0 | 35 | 100 | 35 | 0 | 0 | 0 |
| Comparative Example 8 | PET/Cu/PET/Cu (R1/M1/R2/M2) | Roughening Treatment | 3 | 100 | 18 | 100 | 18 | 0 | 0 | 0 |
| Comparative Example 9 | PET/Cu/PET/Cu/PET/Cu/PET (R1/M1/R2/M2/R3/M3/R4) | Roughening Treatment | 3 | 50 | 18 | 50 | 18 | 50 | 18 | 12 |
| Comparative Example 10 | PET/Cu/PET (R1/M1/R2) | Roughening Treatment | 3 | 100 | 35 | 12 | 0 | 0 | 0 | 0 |
| Comparative Example 11 | PET/Cu/PET (R1/M1/R2) | Roughening Treatment | 10 | 500 | 5 | 500 | 0 | 0 | 0 | 0 |

TABLE 2

|  | R1 and M1 Volume Fraction of Metal Foil $V_{M11}$ | M1 and R2 Volume Fraction of Metal Foil $V_{M12}$ | R2 and M2 Volume Fraction of Metal Foil $V_{M22}$ | M2 and R3 Volume Fraction of Metal Foil $V_{M23}$ | R3 and M3 Volume Fraction of Metal Foil $V_{M33}$ | M3 and R4 Volume Fraction of Metal Foil $V_{M34}$ |
|---|---|---|---|---|---|---|
| Example 1 | 0.24 | 0.24 | — | — | — | — |
| Example 2 | 0.14 | 0.14 | — | — | — | — |
| Example 3 | 0.25 | 0.25 | — | — | — | — |
| Example 4 | 0.15 | 0.15 | — | — | — | — |
| Example 5 | 0.29 | 0.29 | — | — | — | — |
| Example 6 | 0.31 | 0.31 | — | — | — | — |
| Example 7 | 0.39 | 0.39 | — | — | — | — |
| Example 8 | 0.55 | 0.55 | — | — | — | — |
| Example 9 | 0.08 | 0.08 | — | — | — | — |
| Example 10 | 0.03 | 0.03 | — | — | — | — |
| Example 11 | 0.56 | 0.56 | — | — | — | — |
| Example 12 | 0.44 | 0.44 | — | — | — | — |
| Example 13 | 0.24 | 0.24 | — | — | — | — |
| Example 14 | 0.06 | 0.06 | — | — | — | — |
| Example 15 | 0.26 | 0.26 | — | — | — | — |
| Example 16 | 0.26 | 0.26 | — | — | — | — |
| Example 17 | 0.14 | 0.14 | — | — | — | — |
| Example 18 | 0.16 | 0.16 | — | — | — | — |
| Example 19 | 0.25 | 0.25 | — | — | — | — |
| Example 20 | 0.28 | 0.28 | — | — | — | — |
| Example 21 | 0.16 | 0.16 | — | — | — | — |
| Example 22 | 0.16 | 0.16 | — | — | — | — |
| Example 23 | 0.16 | 0.16 | — | — | — | — |
| Example 24 | 0.25 | 0.25 | 0.25 | 0.25 | — | — |
| Example 25 | 0.25 | 0.24 | 0.24 | 0.24 | 0.24 | 0.25 |
| Example 26 | 0.15 | 0.15 | — | — | — | — |
| Example 27 | 0.15 | 0.25 | — | — | — | — |
| Comparative Example 1 | — | — | — | — | — | — |
| Comparative Example 2 | — | — | — | — | — | — |
| Comparative Example 3 | — | — | — | — | — | — |
| Comparative Example 4 | 0.25 | — | — | — | — | — |
| Comparative Example 5 | 0.56 | 0.56 | — | — | — | — |
| Comparative Example 6 | 0.15 | 0.15 | — | — | — | — |
| Comparative Example 7 | — | 0.25 | 0.25 | — | — | — |
| Comparative Example 8 | 0.15 | 0.15 | 0.15 | — | — | — |
| Comparative Example 9 | 0.25 | 0.24 | 0.24 | 0.24 | 0.24 | 0.60 |
| Comparative Example 10 | 0.25 | 0.70 | — | — | — | — |
| Comparative Example 11 | 0.01 | 0.01 | — | — | — | — |

TABLE 3

|  | R1 Breakage Stress of Resin Layer σR1 MPa | R1 Stress of Resin Layer at εM1 σR'11 MPa | M1 Breakage Stress of Metal Foil σM1 MPa | M1 Breakage Strain of Metal Foil εM1 |
|---|---|---|---|---|
| Example 1 | 544 | 110 | 145 | 0.10 |
| Example 2 | 544 | 110 | 210 | 0.10 |
| Example 3 | 415 | 94 | 145 | 0.08 |
| Example 4 | 415 | 93 | 145 | 0.05 |
| Example 5 | 481 | 94 | 145 | 0.04 |
| Example 6 | 509 | 79 | 210 | 0.10 |
| Example 7 | 491 | 76 | 145 | 0.08 |
| Example 8 | 355 | 84 | 145 | 0.08 |
| Example 9 | 579 | 113 | 145 | 0.05 |
| Example 10 | 569 | 107 | 145 | 0.04 |
| Example 11 | 394 | 105 | 210 | 0.18 |
| Example 12 | 162 | 72 | 145 | 0.08 |
| Example 13 | 178 | 78 | 145 | 0.05 |
| Example 14 | 574 | 129 | 210 | 0.18 |
| Example 15 | 620 | 174 | 145 | 0.08 |
| Example 16 | 431 | 101 | 145 | 0.08 |
| Example 17 | 544 | 109 | 281 | 0.18 |
| Example 18 | 415 | 91 | 65 | 0.03 |
| Example 19 | 369 | 85 | 70 | 0.05 |
| Example 20 | 427 | 102 | 75 | 0.11 |
| Example 21 | 579 | 113 | 290 | 0.05 |
| Example 22 | 579 | 115 | 260 | 0.08 |
| Example 23 | 579 | 113 | 275 | 0.05 |
| Example 24 | 579 | 116 | 145 | 0.10 |
| Example 25 | 415 | 94 | 145 | 0.08 |
| Example 26 | 427 | 97 | 145 | 0.08 |
| Example 27 | 427 | 99 | 210 | 0.10 |
| Comparative Example 1 | — | — | 145 | 0.08 |
| Comparative Example 2 | — | — | 240 | 0.37 |
| Comparative Example 3 | — | — | 95 | 0.26 |
| Comparative Example 4 | 563 | 112 | 145 | 0.08 |
| Comparative Example 5 | 178 | 78 | 210 | 0.10 |
| Comparative Example 6 | 57 | 43 | 145 | 0.08 |
| Comparative Example 7 | — | — | 145 | 0.10 |
| Comparative Example 8 | 532 | 80 | 145 | 0.08 |
| Comparative Example 9 | 415 | 94 | 145 | 0.08 |
| Comparative Example 10 | 579 | 130 | 210 | 0.18 |
| Comparative Example 11 | 585 | 110 | 145 | 0.04 |

TABLE 4

|  | R2 Breakage Stress of Resin Layer σR2 MPa | R2 Stress of Resin Layer at εM1 σR'12 MPa | R2 Stress of Resin Layer at εM2 σR'22 MPa | M2 Breakage Stress of Metal Foil σM2 MPa | M2 Breakage Strain of Metal Foil εM2 |
|---|---|---|---|---|---|
| Example 1 | 544 | 110 | — | — | — |
| Example 2 | 544 | 110 | — | — | — |
| Example 3 | 415 | 94 | — | — | — |
| Example 4 | 415 | 93 | — | — | — |
| Example 5 | 481 | 94 | — | — | — |
| Example 6 | 509 | 79 | — | — | — |
| Example 7 | 491 | 76 | — | — | — |
| Example 8 | 355 | 84 | — | — | — |
| Example 9 | 579 | 113 | — | — | — |
| Example 10 | 569 | 107 | — | — | — |
| Example 11 | 394 | 105 | — | — | — |
| Example 12 | 162 | 72 | — | — | — |
| Example 13 | 178 | 78 | — | — | — |
| Example 14 | 574 | 129 | — | — | — |
| Example 15 | 620 | 174 | — | — | — |
| Example 16 | 431 | 101 | — | — | — |
| Example 17 | 544 | 109 | — | — | — |
| Example 18 | 415 | 91 | — | — | — |

TABLE 4-continued

|  | R2 Breakage Stress of Resin Layer σR2 MPa | R2 Stress of Resin Layer at εM1 σR'12 MPa | R2 Stress of Resin Layer at εM2 σR'22 MPa | M2 Breakage Stress of Metal Foil σM2 MPa | M2 Breakage Strain of Metal Foil εM2 |
|---|---|---|---|---|---|
| Example 19 | 369 | 85 | — | — | — |
| Example 20 | 427 | 102 | — | — | — |
| Example 21 | 579 | 113 | — | — | — |
| Example 22 | 579 | 115 | — | — | — |
| Example 23 | 579 | 113 | — | — | — |
| Example 24 | 563 | 114 | 108 | 145 | 0.10 |
| Example 25 | 394 | 90 | 90 | 145 | 0.08 |
| Example 26 | 532 | 80 | — | — | — |
| Example 27 | 192 | 84 | — | — | — |
| Comparative Example 1 | — | — | — | — | — |
| Comparative Example 2 | — | — | — | — | — |
| Comparative Example 3 | — | — | — | — | — |
| Comparative Example 4 | — | — | — | — | — |
| Comparative Example 5 | 178 | 78 | — | — | — |
| Comparative Example 6 | 57 | 43 | — | — | — |
| Comparative Example 7 | 563 | 112 | 112 | 145 | 0.10 |
| Comparative Example 8 | 517 | 79 | 79 | 145 | 0.08 |
| Comparative Example 9 | 394 | 90 | 90 | 145 | 0.08 |
| Comparative Example 10 | 407 | 117 | — | — | — |
| Comparative Example 11 | 585 | 110 | — | — | — |

TABLE 5

|  | R3 Breakage Stress of Resin Layer σR3 MPa | R3 Stress of Resin Layer at εM2 σR'23 MPa | R3 Stress of Resin Layer at εM3 σR'33 MPa | M3 Breakage Stress of Metal Foil σM3 MPa | M3 Breakage Strain of Metal Foil εM3 | R4 Breakage Stress of Resin Layer σR4 MPa | R4 Stress of Resin Layer at εM3 σR'34 MPa |
|---|---|---|---|---|---|---|---|
| Example 1 | — | — | — | — | — | — | — |
| Example 2 | — | — | — | — | — | — | — |
| Example 3 | — | — | — | — | — | — | — |
| Example 4 | — | — | — | — | — | — | — |
| Example 5 | — | — | — | — | — | — | — |
| Example 6 | — | — | — | — | — | — | — |
| Example 7 | — | — | — | — | — | — | — |
| Example 8 | — | — | — | — | — | — | — |
| Example 9 | — | — | — | — | — | — | — |
| Example 10 | — | — | — | — | — | — | — |
| Example 11 | — | — | — | — | — | — | — |
| Example 12 | — | — | — | — | — | — | — |
| Example 13 | — | — | — | — | — | — | — |
| Example 14 | — | — | — | — | — | — | — |
| Example 15 | — | — | — | — | — | — | — |
| Example 16 | — | — | — | — | — | — | — |
| Example 17 | — | — | — | — | — | — | — |
| Example 18 | — | — | — | — | — | — | — |
| Example 19 | — | — | — | — | — | — | — |
| Example 20 | — | — | — | — | — | — | — |
| Example 21 | — | — | — | — | — | — | — |
| Example 22 | — | — | — | — | — | — | — |
| Example 23 | — | — | — | — | — | — | — |
| Example 24 | 579 | 116 | — | — | — | — | — |
| Example 25 | 394 | 90 | 90 | 145 | 0.08 | 415 | 94 |
| Example 26 | — | — | — | — | — | — | — |
| Example 27 | — | — | — | — | — | — | — |
| Comparative Example 1 | — | — | — | — | — | — | — |
| Comparative Example 2 | — | — | — | — | — | — | — |
| Comparative Example 3 | — | — | — | — | — | — | — |
| Comparative Example 4 | — | — | — | — | — | — | — |
| Comparative Example 5 | — | — | — | — | — | — | — |
| Comparative Example 6 | — | — | — | — | — | — | — |
| Comparative Example 7 | — | — | — | — | — | — | — |
| Comparative Example 8 | — | — | — | — | — | — | — |
| Comparative Example 9 | 394 | 90 | 90 | 145 | 0.08 | 162 | 72 |
| Comparative Example 10 | — | — | — | — | — | — | — |
| Comparative Example 11 | — | — | — | — | — | — | — |

TABLE 6

| | R1 and M1 VM'11 | M1 and R2 VM'12 | R2 and M2 VM'22 | M2 and R3 VM'23 | R3 and M3 VM'33 | M3 and R4 VM'34 | R1 and M1 VM11/VM'11 | M1 and R2 VM12/VM'12 | R2 and M2 VM22/VM'22 | M2 and R3 VM23/VM'23 | R3 and M3 VM33/VM'33 | M3 and R4 VM34/VM'34 |
|---|---|---|---|---|---|---|---|---|---|---|---|---|
| Example 1 | 0.75 | 0.75 | — | — | — | — | 0.32 | 0.32 | — | — | — | — |
| Example 2 | 0.67 | 0.67 | — | — | — | — | 0.21 | 0.21 | — | — | — | — |
| Example 3 | 0.69 | 0.69 | — | — | — | — | 0.37 | 0.37 | — | — | — | — |
| Example 4 | 0.69 | 0.69 | — | — | — | — | 0.21 | 0.21 | — | — | — | — |
| Example 5 | 0.73 | 0.73 | — | — | — | — | 0.39 | 0.39 | — | — | — | — |
| Example 6 | 0.67 | 0.67 | — | — | — | — | 0.45 | 0.45 | — | — | — | — |
| Example 7 | 0.74 | 0.74 | — | — | — | — | 0.53 | 0.53 | — | — | — | — |
| Example 8 | 0.65 | 0.65 | — | — | — | — | 0.84 | 0.84 | — | — | — | — |
| Example 9 | 0.76 | 0.76 | — | — | — | — | 0.11 | 0.11 | — | — | — | — |
| Example 10 | 0.76 | 0.76 | — | — | — | — | 0.04 | 0.04 | — | — | — | — |
| Example 11 | 0.58 | 0.58 | — | — | — | — | 0.96 | 0.96 | — | — | — | — |
| Example 12 | 0.38 | 0.38 | — | — | — | — | 1.16 | 1.16 | — | — | — | — |
| Example 13 | 0.41 | 0.41 | — | — | — | — | 0.59 | 0.59 | — | — | — | — |
| Example 14 | 0.68 | 0.68 | — | — | — | — | 0.10 | 0.10 | — | — | — | — |
| Example 15 | 0.75 | 0.75 | — | — | — | — | 0.35 | 0.35 | — | — | — | — |
| Example 16 | 0.69 | 0.69 | — | — | — | — | 0.38 | 0.38 | — | — | — | — |
| Example 17 | 0.61 | 0.61 | — | — | — | — | 0.23 | 0.23 | — | — | — | — |
| Example 18 | 0.83 | 0.83 | — | — | — | — | 0.19 | 0.19 | — | — | — | — |
| Example 19 | 0.80 | 0.80 | — | — | — | — | 0.31 | 0.31 | — | — | — | — |
| Example 20 | 0.81 | 0.81 | — | — | — | — | 0.34 | 0.34 | — | — | — | — |
| Example 21 | 0.62 | 0.62 | — | — | — | — | 0.26 | 0.26 | — | — | — | — |
| Example 22 | 0.64 | 0.64 | — | — | — | — | 0.25 | 0.25 | — | — | — | — |
| Example 23 | 0.63 | 0.63 | — | — | — | — | 0.26 | 0.26 | — | — | — | — |
| Example 24 | 0.76 | 0.76 | 0.76 | 0.76 | — | — | 0.33 | 0.33 | 0.33 | 0.33 | — | — |
| Example 25 | 0.69 | 0.68 | 0.68 | 0.68 | 0.68 | 0.69 | 0.37 | 0.36 | 0.36 | 0.36 | 0.36 | 0.37 |
| Example 26 | 0.69 | 0.76 | — | — | — | — | 0.21 | 0.20 | — | — | — | — |
| Example 27 | 0.61 | 0.34 | — | — | — | — | 0.24 | 0.74 | — | — | — | — |
| Comparative Example 1 | — | — | — | — | — | — | — | — | — | — | — | — |
| Comparative Example 2 | — | — | — | — | — | — | — | — | — | — | — | — |
| Comparative Example 3 | — | — | — | — | — | — | — | — | — | — | — | — |
| Comparative Example 4 | 0.76 | — | — | — | — | — | 0.34 | — | — | — | — | — |
| Comparative Example 5 | 0.32 | 0.32 | — | — | — | — | 1.72 | 1.72 | — | — | — | — |
| Comparative Example 6 | 0.09 | 0.09 | — | — | — | — | 1.74 | 1.74 | — | — | — | — |
| Comparative Example 7 | — | 0.76 | 0.76 | — | — | — | — | 0.33 | 0.34 | — | — | — |
| Comparative Example 8 | 0.76 | 0.75 | 0.75 | — | — | — | 0.20 | 0.19 | 0.19 | — | — | — |
| Comparative Example 9 | 0.69 | 0.68 | 0.68 | 0.68 | 0.68 | 0.38 | 0.37 | 0.36 | 0.36 | 0.36 | 0.36 | 1.56 |
| Comparative Example 10 | 0.68 | 0.58 | — | — | — | — | 0.37 | 1.21 | — | — | — | — |
| Comparative Example 11 | 0.77 | 0.77 | — | — | — | — | 0.01 | 0.01 | — | — | — | — |

TABLE 7

| | Formability Maximum Molding Depth mm | Shielding Effect Magnetic Field at 1 MHz dB | Shielding Effect Electric Field at 100 MHz dB |
|---|---|---|---|
| Example 1 | 8.24 | ◉ | 112 |
| Example 2 | 9.14 | ◉ | 107 |
| Example 3 | 7.83 | ◉ | — |
| Example 4 | 9.51 | ◉ | 103 |
| Example 5 | 7.63 | ◉ | 98 |
| Example 6 | 7.18 | ◉ | — |
| Example 7 | 6.84 | ◉ | — |
| Example 8 | 4.68 | ○ | — |
| Example 9 | 5.47 | ○ | — |
| Example 10 | 5.66 | ○ | — |
| Example 11 | 4.27 | ○ | — |
| Example 12 | 4.10 | ○ | — |
| Example 13 | 5.73 | ○ | — |
| Example 14 | 5.20 | ○ | — |
| Example 15 | 8.25 | ◉ | — |
| Example 16 | 8.26 | ◉ | — |
| Example 17 | 9.27 | ◉ | — |
| Example 18 | 9.26 | ◉ | — |
| Example 19 | 8.26 | ◉ | — |
| Example 20 | 8.68 | ◉ | — |
| Example 21 | 8.86 | ◉ | — |
| Example 22 | 8.91 | ◉ | — |

TABLE 7-continued

|  | Formability | Shielding Effect | |
|---|---|---|---|
|  | Maximum Molding Depth mm | Magnetic Field at 1 MHz dB | Electric Field at 100 MHz dB |
| Example 23 | 9.34 | ◎ | — | — |
| Example 24 | 7.77 | ◎ | 45 | 119 |
| Example 25 | 6.82 | ◎ | 47 | 118 |
| Example 26 | 9.18 | ◎ | — | — |
| Example 27 | 4.88 | ○ | — | — |
| Comparative Example 1 | 0.00 | × | — | — |
| Comparative Example 2 | 0.12 | × | — | — |
| Comparative Example 3 | 0.09 | × | — | — |
| Comparative Example 4 | 2.87 | × | — | — |
| Comparative Example 5 | 2.23 | × | — | — |
| Comparative Example 6 | 2.18 | × | — | — |
| Comparative Example 7 | 2.26 | × | — | — |
| Comparative Example 8 | 2.91 | × | — | — |
| Comparative Example 9 | 3.68 | × | — | — |
| Comparative Example 10 | 3.86 | × | — | — |
| Comparative Example 11 | 3.86 | × | — | — |

(5. Discussion)

In the electromagnetic wave shielding materials according to Examples 1 to 27, the relationship between the metal foils and the resin layers adjacent to each other was good ($0.02 \leq V_M/V_{M'} \leq 1.2$), and they had thus excellent formability.

Further, it was found that by setting the relationship between the metal foils and the resin layers adjacent to each other to be in the preferable range ($0.1 \leq V_M/V_{M'} \leq 0.9$), the formability was improved, and by setting the relationship to be in the more preferable range ($0.2 \leq V_M/V_{M'} \leq 0.6$), the formability was further improved.

In Comparative Examples 1 to 3, only one metal foil was used. Therefore, the formability was poorer as compared with Examples.

In Comparative Examples 4, 7 and 8, the relationship between the metal foils and the resin layers adjacent to each other was good ($0.02 \leq V_M/V_{M'} \leq 1.2$), but there was at least one metal foil, both surfaces of which were not supported by the resin layers, among the metal foils forming each shielding material. Therefore, the formability was poorer as compared with Examples.

In Comparative Examples 5, 6, 9 and 10, the relationship between the metal foils and the resin layers adjacent to each other was not appropriate. Therefore, the formability was poorer as compared with Examples.

What is claimed is:

1. An electromagnetic wave shielding material comprising a multilayer structure in which at least one metal foil and at least two resin layers are laminated,
    wherein both surfaces of each metal foil are laminated to the resin layers;
    wherein the at least two resin layers are free from glass fibers therein; and
    wherein each metal foil satisfies the following relationship with each of the two resin layers adjacent to the metal foil:

$0.02 \leq V_M/V_{M'} \leq 1.2$, in which:

$V_M$ is a volume fraction of the metal foil relative to a total volume of the metal foil and the at least two resin layers;

$V_{M'}$ is $(\sigma_R - \sigma_{R'})/(\sigma_M + \sigma_R - \sigma_{R'})$;

$\sigma_M$ is a true stress (MPa) of the metal foil at breakage when a tensile stress is applied to the metal foil;

$\sigma_R$ is a true stress (MPa) of the resin layer at breakage when a tensile stress is applied to the resin layer; and $\sigma_{R'}$ is a true stress (MPa) of the resin layer when a logarithmic strain same as a logarithmic strain at breakage of the metal foil is applied to the resin layer.

2. The electromagnetic wave shielding material according to claim 1, wherein each metal foil satisfies the following relationship with each of the two resin layers adjacent to the metal foil:

$0.2 \leq V_M/V_{M'} \leq 0.6$.

3. The electromagnetic wave shielding material according to claim 1, wherein each metal foil forming the electromagnetic wave shielding material has a thickness of 4 μm to 100 μm.

4. The electromagnetic wave shielding material according to claim 1, wherein each resin layer forming the electromagnetic wave shielding material has a thickness of 4 μm to 250 μm.

5. The electromagnetic wave shielding material according to claim 1, wherein the metal foil and the resin layers forming the electromagnetic wave shielding material are closely laminated by thermocompression bonding without interposing an adhesive layer.

6. The electromagnetic wave shielding material according to claim 1, wherein a total thickness of the at least one metal foil is 100 μm or less, and a total thickness of the resin layers is 500 μm or less.

7. A method for producing an electromagnetic wave shielding molded article comprising molding the electromagnetic wave shielding material according to claim 1.

8. The method for producing the electromagnetic wave shielding molded article according to claim 7, wherein the molding is carried out by pressure forming.

9. The electromagnetic wave shielding material according to claim 1, wherein the at least two resin layers are free from fiber reinforcing materials therein.

10. The electromagnetic wave shielding material according to claim 1, wherein the at least two resin layers comprise polyethylene terephthalate (PET).

11. The electromagnetic wave shielding material according to claim 10, wherein the at least one metal foil comprises copper.

* * * * *